US 6,675,330 B1

(12) United States Patent
Levy-Kendler et al.

(10) Patent No.: US 6,675,330 B1
(45) Date of Patent: Jan. 6, 2004

(54) TESTING THE OPERATION OF INTEGRATED CIRCUITS BY SIMULATING A SWITCHING-MODE OF THEIR POWER SUPPLY INPUTS

(75) Inventors: Limor Levy-Kendler, Kadima (IL); Yakov Levy, Herzelia (IL); Ian Podkamien, Petach-Tikya (IL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/479,613

(22) Filed: Jan. 7, 2000

(51) Int. Cl.[7] .............................................. G01R 31/28
(52) U.S. Cl. ...................................................... 714/724
(58) Field of Search ................................ 714/736, 718, 714/700, 703, 724; 365/201; 323/312; 327/530; 324/522, 527, 537, 765; 326/16, 17

(56) References Cited

U.S. PATENT DOCUMENTS

| 4,497,056 A | * | 1/1985 | Sugamori ................. 714/736 |
| 4,833,341 A | * | 5/1989 | Watanabe et al. .......... 327/541 |
| 5,023,476 A | * | 6/1991 | Watanabe et al. .......... 327/540 |
| 5,442,277 A | * | 8/1995 | Mori et al. ................. 323/312 |
| 5,559,744 A | * | 9/1996 | Kuriyama et al. .......... 365/201 |
| 5,574,691 A | * | 11/1996 | Tanida et al. ............... 365/201 |
| 5,995,436 A | * | 11/1999 | Brox et al. ................. 365/226 |
| 6,201,754 B1 | * | 3/2001 | Ooishi et al. ............... 365/226 |
| 6,388,853 B1 | * | 5/2002 | Balakrishnan et al. ..... 361/93.9 |

FOREIGN PATENT DOCUMENTS

JP          09257878    * 10/1997    ......... G01R/31/319

* cited by examiner

Primary Examiner—Phung M. Chung
Assistant Examiner—Cynthia Butt

(57) ABSTRACT

Method and apparatus for testing the operation of an integrated circuit (IC) while maintaining the supply input to the IC constantly active during the test. A logic indication signal that provides a first logic level indicating the active state of the supply input and a second logic level indicating the inactive state of the supply input, is generated. The inactive state of the supply input is simulated by processing the first logic level and by generating a third logic level that is essentially similar, or identical, to the second logic level. The third logic level is applied to one or more signal-carrying contacts within the IC and these, or other, signal-carrying contacts within the IC are accessed and their corresponding signal values responsive to the applied third logic level are read. One or more read signal values are compared with the one or more values expected for such readings.

35 Claims, 1 Drawing Sheet

TESTING THE OPERATION OF INTEGRATED CIRCUITS BY SIMULATING A SWITCHING-MODE OF THEIR POWER SUPPLY INPUTS

FIELD OF THE INVENTION

The present invention relates to the testing of the functionality of Integrated Circuits (ICs). More particularly, the invention relates to a method and apparatus for testing the operation of ICs by comparing signals therefrom, generated in response to a digitally simulated switching-mode of their power supply inputs, with an expected-value.

BACKGROUND OF THE INVENTION

Conventional integrated circuit (IC) testing is performed by applying a plurality of test pattern signals to the IC inputs so that a response pattern signals that are obtained at its outputs correspond to expected predetermined values. Therefore, testing the proper operation of an IC is essential both during the design ("pre-silicon") before semiconductor fabrication, and after fabrication ("post-silicon"), such as during quality assurance procedures.

In practice, in order to assure its proper functionality, such tests may encompass all, or a part of its inputs and outputs. The inputs of each IC may comprise functional inputs and one or more power-supply inputs. In many ICs, the functionality of several, or all, of the outputs depends not only on the pattern of signals applied to the inputs, but also on changes in the power supply states (mainly during switching transitions). This aspect may be of particular relevance when the power supply voltage is used also to define logical states, such as when a logical state is represented by a voltage level which is identical to the power supply voltage. Therefore, in order to verify the proper operation of an IC, it is essential to test its response to varying power supply states.

Conventional (and straightforward) methods for testing the response of an IC to varying power supply states involve the actual switching of the voltage applied to the supply inputs between on and off states (i.e., toggling between nominal "off-state" voltage and the nominal "on-state" voltage of the power supply) or disconnecting and reconnecting the corresponding supply inputs of the IC from the power line (e.g., by a serial switch). These methods are problematic, since the time required for the power supply voltage to reach the desired value is relatively long. Since many toggling transients are required to perform a complete test pattern, these effects cause accumulated time delays which increase the total test time of the IC and therefore increases test costs.

In addition, time delay is critical also during design verification of the IC, when its performance is tested theoretically using computer simulations. Initialization of the IC is required each time the power supply voltage is raised (transition from inactive to active state), and therefore the overall simulation time is increased.

U.S. Pat. No. 4,497,056 describes an IC tester that supplies test pattern signals to an IC under test and compares response signals therefrom with an expected value pattern. The test pattern signals are shaped before applying them to the tested IC, by inserting a variable delay in the paths of the test pattern signals. The delay in each path is adjusted to suppress skews between the paths. However, the test performed by this test-mode setting circuit is directed to the functionality of the logical functions, without testing the functionality of the IC under varying states of the power supply.

U.S. Pat. No. 5,559,744 describes a test-mode setting circuit integrated into an IC. The test content is latched in a latch circuit in response to a test mode setting permission signal. An AND circuit is used for deriving AND operation of the test mode setting permission signal and an input signal. The latch circuit is set by an output of the AND circuit, and reset by a release signal. The test is performed according to the setting circuit and the latched data. However, the test performed by this test-mode setting circuit is also directed to the functionality of the logical functions, without testing the functionality of the IC under varying states of the power supply.

U.S. Pat. No. 5,442,277 describes an internal power supply circuit which comprises a main internal power supply potential generating circuit, and an auxiliary internal power supply potential generating circuit, both generating power supply potentials by lowering an external power supply potential. The main power supply potential is produced constantly at an output node when a switching element connected between the main power supply potential and the output node is conducting. The auxiliary power supply potential is activated in response to a control signal, and when activated, produces another internal power supply potential together with the main power supply potential. A standby circuit provides a standby voltage to the switching element in order to replace the power supply potential upon receiving a corresponding control signal. However, in this power supply circuit, the supplied voltage is disconnected from the circuit that it supplies during the test, and therefore the test time is extended.

All the methods described above have not yet provided satisfactory solutions to the problem of testing the operation of ICs in response to a switching-mode of their power supply inputs, without disconnecting the supply voltage from the IC's input.

Objects, of the present invention include providing a method and apparatus for testing the operation of ICs in response to a switching-mode of their power supply inputs, in which:

a) the supply voltage is not disconnected from the IC's input during the test;

b) test time is decreased; and c) logical states of particular areas within the IC are tested under no supply, while maintaining other power supplies active or inactive.

Other objects and advantages of the invention will become apparent as the description proceeds.

SUMMARY OF THE INVENTION

The present invention is directed to a method for testing the operation of an integrated circuit (IC) while maintaining the supply input to the IC constantly active during the test. A logic indication signal that provides a first logic level indicating the active state of the supply input and a second logic level indicating the inactive state of the supply input, is generated. The inactive state of the supply input is simulated by processing the first logic level and by generating a third logic level that is essentially similar, or identical, to the second logic level. The third logic level is applied to one or more signal-carrying contacts within the IC and these, or other, signal-carrying contacts within the IC are accessed and their corresponding signal values responsive to the applied third logic level are read. One or more read signal values are compared with the one or more values expected for such readings.

Preferably, whenever desired during the test, the first logic level is applied back to one or more signal-carrying contact (s) within the IC, and their corresponding signal values responsive to the applied first logic level are read. One or more read values are compared with one or more values expected for such readings.

The inactive state of the supply input may be simulated by using an intervening logic circuit in the IC. The intervening logic circuit has at least one input connected to the logic indication signal, at least one intervention input, and at least one output connected to the signal-carrying contacts. The intervention input is controlled to transfer the logic indication signal unchanged, from the at least one input to the output, whenever an active state indication is desired. Whenever an inactive state indication is desired, an opposite logic indication signal is generated and transferred from the at least one input to the output. The intervention input may be controlled through a specific contact in the IC, which can be accessed externally to the IC.

Preferably, the IC includes a programmable control signal source for internally controlling the intervention input of the intervening logic circuit. The control signal source is programmed with a first test signal pattern and the control signal source is activated to internally control the intervention input, according to the first test signal pattern by, and in combination with, a second test signal pattern applied to the logic inputs of the IC.

The IC may be tested by using computerized models of its components and interconnections and/or of the power supplied input signals and/or the logic input/output signals applied to, or generated by, the IC. Preferably, simulated test signal patterns and intervention/control signals are generated by suitable test software. A simulated test of the IC is performed by applying the test signal patterns and the intervention/control signals to the corresponding input in the computerized model. Preferably, using the unchanged logic indication signal at the output of the intervening logic circuit as a power supply voltage, whenever the power supply voltage is essentially similar to the high state of the logic indication signal.

The invention is also directed to an apparatus for testing the operation of an integrated circuit (IC) while maintaining the supply input to the IC constantly active during the test, including:

a) circuitry for generating a logic indication signal, the indication signal providing a first logic level indicating the active state of the supply input, and a second logic level indicating the inactive state of the supply input;

b) circuitry for simulating the inactive state of the supply input by processing the first logic level and by generating a third logic level essentially similar, or identical, to the second logic level;

c) means for applying the third logic level to one or more signal-carrying contacts within the IC; and d) means for accessing the, or other, signal-carrying contacts within the IC, and for reading their corresponding signal values responsive to the applied third logic level.

Preferably, the apparatus, includes an intervening logic circuit having at least one input connected to the logic indication signal, at least one intervention input, and at least one output connected to the signal-carrying contacts; and circuitry for controlling the intervention input to transfer the logic indication signal unchanged, from the at least one input to the output, whenever an active state indication is desired, and to generate and transfer an opposite logic indication signal from the at least one input to the output, whenever an inactive state indication is desired.

The apparatus may include a specific contact in the IC, which can be accessed externally to the IC, through which the intervention input is controlled. The apparatus may further include a programmable control-signal source in the IC, for internally controlling the intervention input of the intervening logic circuit; means for programming the control-signal source with a first test signal pattern; and means for activating the control-signal source to internally control the intervention input, according to the first test signal pattern by, and in combination with, a second test signal pattern applied to the logic inputs of the IC. The apparatus may also include means for testing the IC using computerized models of its components and interconnections and/or of the power supplied input signals and/or the logic input/output signals applied to or generated by the IC.

Preferably, the apparatus further includes means for generating simulated test signals pattern and intervention/control signals by suitable test software, and means for performing a simulated test of the IC by applying the test signals pattern and the intervention/control signals to the corresponding input in the computerized model. The unchanged logic indication signal at the output of the intervening logic circuit may be used as a power supply voltage, whenever the power supply voltage is essentially similar to the high state of the logic indication signal.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
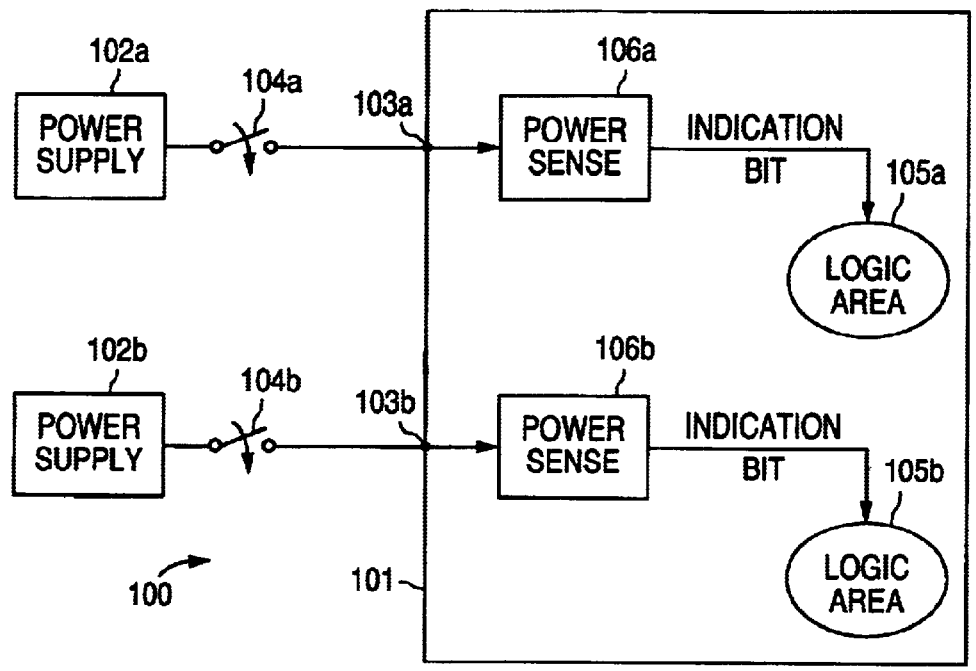
FIG. 1 schematically illustrates a conventional IC testing system which employs actual toggling of the power supply input.

FIG. 1 schematically illustrates a conventional IC testing system which employs actual toggling of the power supply input for testing the functionality of a particular logical area within the IC or of the whole IC, in response to varying conditions of the applied supply voltage. The system 100 comprises an IC 101 and one or more power supplies 102*a* and 102*b* for feeding its supply inputs 103*a* and 103*b*, respectively. Switching elements 104*a* and 104*b* are connected between each power supply output and the corresponding input which it supplies. Each of the power supply inputs 103*a* and 103*b* feeds a logical area 105*a* and 105*b*, respectively, within the IC circuitry. Each logical area 105*a* or 105*b* may comprise a single logical circuitry or a plurality of logical circuits that may be connected to each other. The IC 101 also comprises a power sensing circuitry 106*a* or 106*b*, connected to each supply input. Each power sensing circuitry detects the voltage level applied to its corresponding IC input and outputs a logical level that indicates whether the power supply connected to that IC input is active or inactive. For example, if the power supply 102*a* is active (i.e., a proper voltage is applied to the corresponding IC input 103*a*), the power sensing circuitry 106*a* outputs a "1" logic, and outputs a "0" logic if the power supply 102*a* is inactive. Generally, a power supply is considered to be active if the supplied voltage is maintained within a predetermined voltage "window" under maximum load conditions presented by the supplied IC, and is considered to be inactive if the supply voltage lies between zero voltage and another predetermined voltage, or removed (i.e., the corresponding IC input becomes disconnected). In this prior art implementation, the switches 104*a* and 104*b* are controlled externally to vary the state of each IC input by connecting/disconnecting the IC input to the power supply output voltage. Of course, other external switching schemes, such as shortening the IC supply input to ground (zero voltage) or lowering the power supply output voltage level below a predetermined value may be implemented.

The logic level indicative of the power supply input state which is produced by the power sensing circuitry 106*a* is input into the corresponding logical area 105*a*, and the response of that logical area to that logic level is then tested. In practice, the switching element 104*a* is controlled according to a predetermined pattern, so as to provide a test signals pattern that encompasses a complete desired set of power supply transitions between active and inactive states. The outputs and/or other points in the logical area 105*a* are accessed and their corresponding logical values are read and compared with a set of expected values. Inferences related to the proper operation of the tested logical area 105*a* are made according to the comparison results.

The expected response signals (logic levels) may result from transition from active to inactive power supply state and/or vice-versa, and may comprise any predetermined logical operation. For example, a flip-flop that should be reset whenever there is transition from its active state to its inactive state (i.e., whenever the "1" logic produced at the output of the power sensing circuitry 106*a* falls to "0" logic), will act accordingly. Other logic functions may also be controlled or may depend on such transition, and can be tested accordingly. Therefore, during the test, the power voltage is toggled at the IC input 103*a* (and/or at other IC inputs) and a time dependent corresponding signal pattern is generated at the output of the power sensing circuitry 106*a* (varying between "0" and "1" logic values). Finally, the response of the logical area 105*a* to the time dependent corresponding signal pattern is tested at predetermined points in the IC. In addition, the proper operation of the IC 101 may also be tested by concurrently toggling the power voltage and applying another test signals pattern to one or more logical inputs of the IC 101. These conventional tests however, employ actual toggling of the voltage levels at the IC's supply inputs, and therefore suffer from the drawbacks of prior art hereinbefore described.

Figure 2:
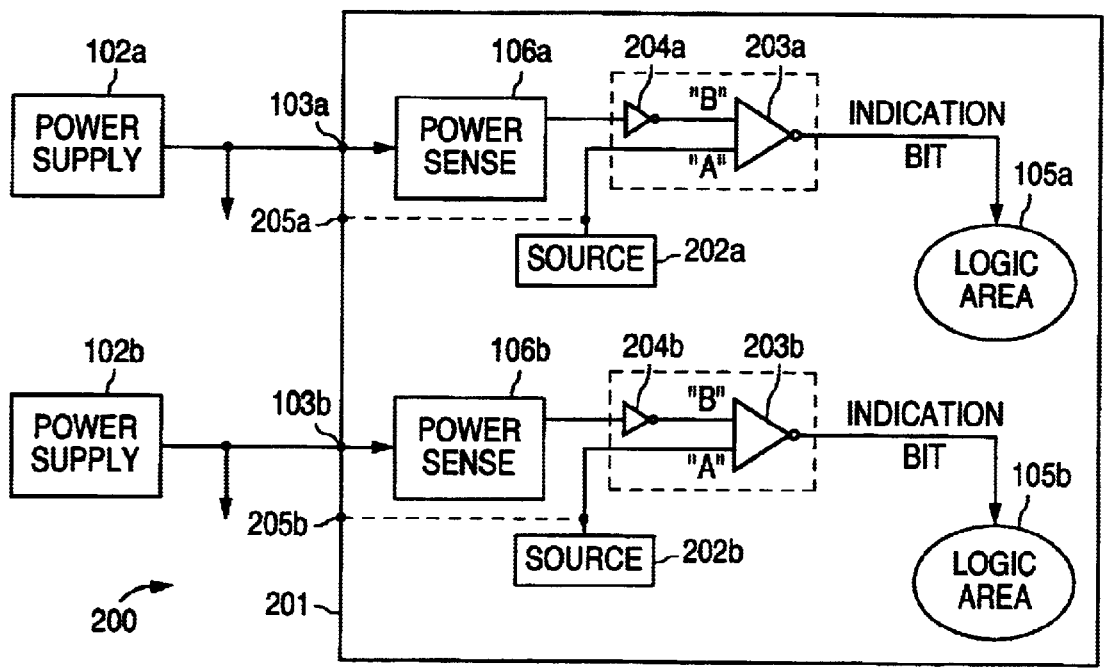
FIG. 2 schematically illustrates an IC testing system in which the voltage at the IC supply inputs remains constantly active during the whole test cycle, according to a preferred embodiment of the invention.

In contradistinction to conventional methods, the present invention provides an apparatus which digitally simulates the power supply transitions between active and inactive states, without actually disconnecting or changing the voltage at the supply inputs to the tested IC. FIG. 2 schematically illustrates an IC testing system in which the voltage at the IC supply inputs remains constantly active during the whole test cycle, according to a preferred embodiment of the invention. Both active and inactive states (or each one of them, separately) are simulated by a digital input, which may be provided internally (by a circuit within the IC), or externally to the IC (e.g., through a specific pin). The system 200 comprises one or more power supplies 102*a* and 102*b* constantly connected to the power supply inputs of an IC 201. As a result, the output of the power sensing circuitry 106*a* of the IC 201 produces a constant "1" logic level (of course, an opposite logic level may be used to indicate that the power supply 102*a* is active). The IC 201 also comprises a test-bit source 202*a* which may be connected to an external input, or may be internal (part of the IC). The test-bit source 202*a* outputs a signal which is fed into an input "A" of a NOR gate 203*a*. The output of the power sensing circuitry 106*a* is inverted by a logic inverter 204*a* and then fed into the other input "B" of the NOR gate 203*a*. The result of the NOR operation between input "A" and input "B" is fed to the logical area 105*a* as a new (and modified) logical level that simulates the indication whether the power supply 102*a* connected to that IC input is active or inactive.

For example, if a "1" logic is used to indicate that the power supply 102*a* is active, a "0" logic constantly appears at input "B". As long as the output of the test-bit source 202*a* is kept at "0" logic level, the "1" logic that constantly appears at the output of the power sensing circuitry 106*a* is converted to "0" logic by inverter 204*a* and back to "1" logic by the NOR gate 203*a*. Therefore, the indicative logic level produced at the output of the power sensing circuitry 106*a* is transferred unchanged into the corresponding logical area 105*a*. On the other hand, if the output of the test-bit source 202*a* is varied to "1" logic level (i.e., "1" logic appears at input "A"), the NOR gate 203*a* outputs a "0" logic (the resulting NOR operation between "1" at input "A" and "0" at input "B"), which is equivalent to the inactive state of the power supply 102*a*, while the power supply 102*a* actually remains active and continues to supply power to the IC 200 and/or to other circuits. Therefore, the input "A" of the NOR gate 203*a* provides the capability of intervention in the logical indication that is input into the logical area 105*a*, and allows to simulate a "virtual inactive" state of the power supply 102*a* by controlling that input. Actually, the indicative logic level produced at the output of the power sensing circuitry 106*a* is modified (by controlling the input "A")

before it is input into the corresponding logical area 105a. This enables to introduce an alternating indicative logic level, as desired during the IC test cycle, to the logical area 105a by using digital control through input "A", while maintaining the voltage at the supply IC inputs constantly active. This also allows the power supply 102a to feed other circuits and/or other supply inputs of the IC 201, which consume power continuously. The rise-time and fall-time of the generated supply control -pattern are substantially shorter than the response time of actually switched power supply input. Therefore, the fact that the simulated transitions of the power supply states is performed digitally, substantially reduces the time required to complete a test cycle.

According to a preferred embodiment of the invention, the input "A" may be controlled by assigning a specific contact 205a in the IC 201 for controlling the simulation of alternating power supply states, which can be accessed through a corresponding control pin when the IC 201 is packaged. During the test, the desired supply control pattern can be supplied to the control pin in combination with a test signal pattern supplied to the logical inputs of the IC.

According to another preferred embodiment of the invention, the input "A" may be controlled by a logic circuit integrated into the IC 201. The logic circuit may be for example, a shift-register or a memory programmed to output a desired control signal pattern for controlling the simulation of alternating power supply states. The desired supply control pattern can be linked to logic control inputs of the IC and operate in combination with the test signal pattern supplied to them.

The invention also allows to substantially reduce the time required to perform a complete test cycle also during the design phase of an IC, where the functionality of the IC is tested from a theoretical point of view, using suitable software and/or computer programs for a complete simulation of the IC's performance. The analysis made by these computer simulations is carried out by suitable modeling of the components that constitute the IC and the connections between them. During the test, simulated test signals pattern, as well as simulated power supply transients are applied to the "inputs" of the modeled IC. The response signals obtained at predetermined points in the modeled IC are compared with a set of expected value. The time required for running a simulated test is strongly extended when the simulated power supply voltage is toggled, since a relatively long time is required for initialization of the IC during simulation. Therefore, using simulated digital intervention, by controlling the logical indication that is input to the logical area 105a, also shortens the time required to run a simulated test cycle of a modeled IC.

According to another preferred embodiment of the invention, whenever the power supply voltage is essentially similar to the voltage that determines a logic level, the output voltage of the NOR gate 203a can be used as a power supply voltage, up to the limit of current consumption which can be supplied.

The above examples and description have of course been provided only for the purpose of illustration, and are not intended to limit the invention in any way. As will be appreciated by the skilled person, the invention can be carried out in a great variety of ways, such as using other (or opposite) logic levels to represent active and/or inactive states, employing more than one technique from those described above, such as using different configurations to implement the circuitry for the simulation of active and/or inactive states, all without exceeding the scope of the invention.

What is claimed is:

1. A method for testing the operation of an integrated circuit (IC) while maintaining a supply input to said IC constantly active during a test, comprising:

generating a logic indication signal, said indication signal providing a first logic level indicating an active state of said supply input and a second logic level indicating an inactive state of said supply input;

simulating the inactive state of said supply input by processing said first logic level and by generating a third logic level that is at least substantially similar to said second logic level;

applying said third logic level to one or more of at least one signal-carrying contact within said IC;

accessing one or more of said at least one signal-carrying contact within said IC and reading one or more corresponding signal values responsive to said applied third logic level; and comparing said one or more read signal values with one or more expected values.

2. A method according to claim 1, further comprising the steps of:

applying back said first logic level to one or more of said at least one signal-carrying contact within said IC and reading one or more second signal values responsive to said applied first logic level; and comparing said one or more read second signal values with one or more second expected values.

3. A method according to claim 1, wherein the inactive state of the supply input is simulated by performing the following steps:

providing in the IC an intervening logic circuit having at least one input connected to the logic indication signal, at least one intervention input, and at least one output connected to one or more of said at least one signal-carrying contact; and controlling said intervention input to transfer said logic indication signal unchanged, from said at least one input to said output, whenever an active state indication is desired, and generating and transferring an opposite logic indication signal from said at least one input to said output, whenever an inactive state indication is desired.

4. A method according to claim 3, wherein the intervention input is controlled through a specific contact in the IC, which can be accessed externally to said IC.

5. A method according to claim 3, further comprising:

providing in the IC a programmable control signal source for internally controlling the intervention input of the intervening logic circuit;

programming said control signal source with a first test signal pattern; and activating said control signal source to internally control said intervention input, according to said first test signal pattern by, and in combination with, a second test signal pattern applied to logic inputs of said IC.

6. A method according to claim 3, further comprising using the unchanged logic indication signal at the output of the intervening logic circuit as a power supply voltage, whenever said power supply voltage is essentially similar to a high state of said logic indication signal.

7. A method according to claim 1, wherein the IC is tested by using computerized models of at least one of: its components and interconnections, the power supplied input signals, logic input signals applied to said IC, and logic output signals generated by said IC.

8. A method according to claim 7, further comprising generating simulated test signal patterns and intervention/control signals using test software, and performing a simulated test of the IC by applying said test signal patterns and said intervention/control signals to at least one corresponding input in the computerized model.

9. Apparatus for testing the operation of an integrated circuit (IC) while maintaining a supply input to said IC constantly active during a test, comprising:

circuitry for generating a logic indication signal, said indication signal providing a first logic level indicating an active state of said supply input and a second logic level indicating an inactive state of said supply input;

circuitry for simulating the inactive state of said supply input by processing said first logic level and by generating a third logic level that is at least substantially similar to said second logic level;

means for applying said third logic level to one or more of at least one signal-carrying contact within said IC; and means for accessing one or more of said at least one signal-carrying contact within said IC and reading one or more corresponding signal values responsive to said applied third logic level.

10. Apparatus according to claim 9, comprising:

an intervening logic circuit having at least one input connected to the logic indication signal, at least one intervention input, and at least one output connected to one or more of said at least one signal-carrying contact; and circuitry for controlling said intervention input to transfer said logic indication signal unchanged, from said at least one input to said output, whenever an active state indication is desired, and to generate and transfer an opposite logic indication signal from said at least one input to said output, whenever an inactive state indication is desired.

11. Apparatus according to claim 10, comprising a specific contact in the IC which can be accessed externally to the IC, through which the intervention input is controlled.

12. Apparatus according to claim 10, further comprising:

a programmable control-signal source in the IC for internally controlling the intervention input of the intervening logic circuit;

means for programming said control-signal source with a first test signal pattern; and means for activating said control-signal source to internally control said intervention input, according to said first test signal pattern by, and in combination with, a second test signal pattern applied to logic inputs of said IC.

13. Apparatus according to claim 10, in which the unchanged logic indication signal at the output of the intervening logic circuit is used as a power supply voltage, whenever said power supply voltage is essentially similar to a high state of said logic indication signal.

14. Apparatus according to claim 9, comprising means for testing the IC using computerized models of at least one of: its components and interconnections, the power supplied input signals, logic input signals applied to said IC, and logic output signals generated by said IC.

15. Apparatus according to claim 14, further comprising means for generating simulated test signal patterns and intervention/control signals using test software, and means for performing a simulated test of the IC by applying said test signal patterns and said intervention/control signals to at least one corresponding input in the computerized model.

16. A method, comprising:

supplying an input voltage signal to an integrated circuit; and testing at least a portion of the integrated circuit using an indication signal, the indication signal comprising a first logic level representing an active state of the input voltage signal and a second logic level representing an inactive state of the input voltage signal;

wherein the input voltage signal remains at the active state during the testing.

17. A method according to claim 16, wherein the indication signal is generated by:

producing a first signal indicating that the input voltage signal is in the active state, the first signal having a constant value;

generating a second signal having varying values; and generating the indication signal using the first and second signals.

18. A method according to claim 17, wherein generating the indication signal using the first and second signals comprises:

inverting the first signal; and performing a logical NOR operation on the inverted first signal and the second signal to generate the indication signal.

19. A method according to claim 17, wherein generating the second signal comprises generating the second signal using a control pattern from a source that is external to the integrated circuit.

20. A method according to claim 17, wherein generating the second signal comprises generating the second signal internally to the integrated circuit.

21. A method according to claim 16, wherein testing at least a portion of the integrated circuit comprises:

supplying one or more logical inputs to the integrated circuit; and comparing one or more logical values generated by the integrated circuit to one or more expected values.

22. A method according to claim 16, wherein a power supply operable to supply the input voltage signal to the integrated circuit remains coupled to the integrated circuit throughout the testing.

23. An integrated circuit, comprising:

an input operable to receive an input voltage signal; and circuitry operable to receive an indication signal and generate one or more values during a test of the integrated circuit, the indication signal comprising a first logic level representing an active state of the input voltage signal and a second logic level representing an inactive state of the input voltage signal;

wherein the input voltage signal remains at the active state during the test.

24. An integrated circuit according to claim 23, further comprising circuitry operable to generate the indication signal.

25. An integrated circuit according to claim 24, wherein the circuitry operable to generate the indication signal comprises:

a power sensing circuit operable to produce a first signal indicating that the input voltage signal is in the active state, the first signal having a constant value;

a signal source operable to generate a second signal having varying values; and combinatorial logic operable to generate the indication signal using the first and second signals.

26. An integrated circuit according to claim 25, wherein the combinatorial logic comprises:

an inverter operable to invert the first signal; and a NOR gate operable to receive the inverted first signal and the second signal and to generate the indication signal.

27. An integrated circuit according to claim 25, wherein the signal source is operable to generate the second signal by receiving a control signal pattern from a source that is external to the integrated circuit, the control pattern operable to control the generation of the second signal by the signal source.

28. An integrated circuit according to claim 25, wherein the signal source comprises one of a shift-register and a memory operable to be programmed to output the second signal.

29. An integrated circuit according to claim 23, wherein a power supply operable to supply the input voltage signal to the input remains coupled to the input throughout the test.

30. A method, comprising:

simulating operation of an integrated circuit using a test signal pattern representing one or more logical inputs for the integrated circuit and an indication signal, the indication signal comprising a first logic level representing an active state of a simulated power supply voltage and a second logic level representing an inactive state of the simulated power supply voltage;

wherein the simulated power supply voltage remains at the active state during the simulation.

31. A method according to claim 30, further comprising electronically modeling the integrated circuit.

32. A method according to claim 31, wherein electronically modeling the integrated circuit comprises modeling a plurality of components of the integrated circuit and a plurality of interconnections between the components.

33. A computer program operable to be executed by a processor, the computer program comprising computer readable program code for:

simulating operation of an integrated circuit using a test signal pattern representing one or more logical inputs for the integrated circuit and an indication signal, the indication signal comprising a first logic level representing an active state of a simulated power supply voltage and a second logic level representing an inactive state of the simulated power supply voltage;

wherein the computer readable program code maintains the simulated power supply voltage at the active state during the simulation.

34. A computer program according to claim 33, further comprising computer readable program code for electronically modeling the integrated circuit.

35. A computer program according to claim 34, wherein the computer readable program code for electronically modeling the integrated circuit comprises computer readable program code for modeling a plurality of components of the integrated circuit and a plurality of interconnections between the components.

* * * * *